United States Patent
Cho et al.

(10) Patent No.: US 7,284,317 B2
(45) Date of Patent: Oct. 23, 2007

(54) METHOD OF PRODUCING PRINTED CIRCUIT BOARD WITH EMBEDDED RESISTOR

(75) Inventors: Suk-Hyun Cho, Daejeon (KR); Jang-Kyu Kang, Daejeon (KR); Byung-Kook Sun, Seoul (KR); Jong-Kuk Hong, Chungcheongnam-do (KR); Seok-Kyu Lee, Chungcheongbuk-do (KR); Jin-Yong Ahn, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 467 days.

(21) Appl. No.: 10/770,806

(22) Filed: Feb. 3, 2004

(65) Prior Publication Data

US 2005/0175385 A1    Aug. 11, 2005

(30) Foreign Application Priority Data

Nov. 5, 2003    (KR) ..................... 10-2003-0077949

(51) Int. Cl.
*H01C 17/28*    (2006.01)

(52) U.S. Cl. .................. 29/619; 29/610.1; 29/621; 29/830; 29/832; 29/844; 29/847; 174/255; 174/260; 338/199; 338/252; 338/311

(58) Field of Classification Search ................ 29/619, 29/610.1, 621, 830, 832, 844, 847; 174/255, 174/260; 338/199, 252, 311
See application file for complete search history.

(56) References Cited

U.S. PATENT DOCUMENTS 4,892,776 A    1/1990  Rice
5,043,695 A *  8/1991  Simon et al. ............... 338/199
5,510,594 A    4/1996  Mori et al.
6,229,098 B1 * 5/2001  Dunn et al. ................. 174/260

FOREIGN PATENT DOCUMENTS

| EP | 0 569 801 A1 | 11/1993 |
| JP | 58-107694 | 6/1983 |
| JP | 63110692 A | 5/1988 |
| JP | 02-058890 | 2/1990 |
| JP | 02-103993 | 4/1990 |
| JP | 04-069252 | 3/1992 |
| JP | 04-127599 | 4/1992 |
| JP | 04-145694 | 5/1992 |
| JP | 06061651 A | 3/1994 |
| JP | 10-106432 | 4/1998 |
| JP | 10190183 A | 7/1998 |
| JP | 2000-202986 | 7/2000 |

* cited by examiner

*Primary Examiner*—A. Dexter Tugbang
*Assistant Examiner*—Tim Phan
(74) *Attorney, Agent, or Firm*—Christensen O'Connor Johnson & Kindness PLLC

(57) ABSTRACT

Disclosed is a method of producing a printed circuit board (PCB) with an embedded resistor, in which a resistor with a desired shape and volume is precisely formed using a resistor paste so that resistance values according to a position of the PCB are uniform, thereby a laser trimming process is omitted or minimally utilized. The method has advantages in that a production time of the PCB is shortened and productivity is improved because an operation condition is rapidly set without being greatly affected by the position precision of a printing device. Other advantages of the method are that the resistor paste with a relatively uniform thickness is secured through a screen printing process, thereby easily forming the resistor and improving resistance tolerance.

16 Claims, 13 Drawing Sheets

METHOD OF PRODUCING PRINTED CIRCUIT BOARD WITH EMBEDDED RESISTOR

CROSS REFERENCE TO RELATED APPLICATION

This application claims priority to Korean Patent Application No. 2003-77949, filed Nov. 5, 2003.

FIELD OF THE INVENTION

The present invention pertains to a method of producing a printed circuit board (PCB) with an embedded resistor. More particularly, the present invention relates to a method of producing a PCB with an embedded resistor, in which a resistor with a desired shape and volume is precisely formed using a resistor paste so that resistance values according to a position of the PCB are uniform, thereby a laser trimming process is omitted or minimally utilized. Accordingly, the method has advantages in that a production time of the PCB is shortened and productivity is improved because an operation condition is rapidly set without being greatly affected by the position precision of a printing device. Other advantages of the method are that the resistor paste with a relatively uniform thickness is secured through a screen printing process, thereby easily forming the resistor and improving resistance tolerance.

DESCRIPTION OF THE RELATED ART

Generally, a PCB includes a substrate on which parts of an electronic circuit are mounted. In this regard, most of wires are formed on the substrate according to an exposing and an etching process, and the parts are mounted on the substrate and connected to the wires on the substrate in accordance with a predetermined circuit design. An electronic device includes many active and passive parts mounted on a circuit substrate. Of the passive parts, a plurality of discrete chip resistors are mounted on the circuit substrate to serve to smoothly transmit signals between the active parts. However, the chip resistors are disadvantageous in that it is difficult to apply the discrete chip resistors to light and small electronic parts, and the discrete chip resistors occupy a relatively large area.

To avoid the above disadvantages, a technology of embedding a resistor in the PCB is suggested instead of using the discrete chip resistors.

The PCB with the embedded resistor includes the resistor acting as a passive component inside or outside itself regardless of a size of the PCB, and the passive component constitutes a part of the PCB. That is to say, because the passive component is incorporated in the PCB, it is not necessary to mount the discrete chip resistors on the substrate or connect the discrete chip resistors to the substrate. Hence, the PCB with the embedded resistor has advantages in that other parts are mounted on a space occupied by the discrete chip resistors to secure a highly integrated-mounting area, the downsizing of the electronic device including the PCB with the embedded resistor is feasible because a size of the PCB is reduced, and the PCB with the embedded resistor can be applied to devices requiring reliability because a solder joint is removed and the PCB is less affected by heat, or physical impact and vibration.

Many efforts have been made to form the embedded-type resistor, and a detailed description of commercialized technologies of forming the embedded-type resistor will be given, below.

Firstly, a technology of forming a ceramic thick film type of resistor is suggested, in which a ceramic resistor paste is coated on a substrate and sintered. According to this technology, after the ceramic resistor paste is coated on a surface of the substrate and sintered at about 850 to 900° C., a glass layer is coated on the ceramic resistor paste according to a screen printing process to protect the resistor paste, and the ceramic resistor paste coated with the glass layer is sintered, as indicated by U.S. Pat. No. 5,510,594 (hereinafter '594). With respect to the technology of forming the ceramic resistor, the patent discloses that an electrode made of a conductive material, including silver, is formed on the substrate made of a dielectric material such as alumina, and a thick film resistor made of a resistant material, such as cermet, is formed as a way to be electrically connected to the electrode. At this time, a desired resistor value is secured through a laser trimming process and a dielectric protective film is formed on the substrate to protect the electrode and resistor. However, the '594 is applied to only a ceramic substrate, but cannot be directly applied to a resin-based substrate, for example, a substrate made of epoxy-glass or polyimide.

Secondly, there is a technology of forming a thin film type of resistor, in which a separate metal layer or metal film with resistance characteristics is formed in a PCB instead of a resistor mounted on a surface of the PCB. With respect to this, a method of producing a PCB with an embedded resistor using a thin film resistant material such as Ohmega-Ply® (manufactured by Ohmega Technologies, Inc.) is already commercialized.

For example, the PCB with the embedded resistor may be produced according to a photolithographic process using the resistant material including a support layer suggested by U.S. Pat. No. 4,892,776 (hereinafter '776), at least one resistant layer containing nickel and phosphorus and combined with the support layer, and a conductive layer combined with the resistant layer. At this time, because the resistor is embedded in the PCB and protected by a dielectric material, there is not needed a separate process in order to prevent the resistor from being affected by exterior environments.

Thirdly, there is suggested a process of forming a polymer thick film type of resistor, in which a polymer-based resistor paste is coated on a substrate and cured. The process is classified into an interior-type process in which the polymer-based resistor paste is coated on an inner layer of the substrate, and an exterior-type process in which the polymer-based resistor paste is coated on an outermost layer of the substrate.

Conventional technologies relating to the interior-type process are disclosed in, for example, EP 0 569 801 A1 and Japanese Pat. Laid-Open Publication No. Hei 6-61651. According to the above patents, the resistor is formed in a shape of a thick film on an inner surface of the PCB including conductive lines on both sides thereof through a printing process, and a surface mounting device (SMD) is mounted on an outer surface of the PCB. Additionally, an intermediate layer consisting of a dielectric material is pressed between the inner surfaces of the PCBs in such a way that the intermediate layer is positioned between the inner surfaces of the PCBs. Further, the interior-type process does not require a separate protective layer in order to suppress an effect by external environments because the resistor is formed between the PCBs. However, the above patents are disadvantageous in terms of predictability and tolerance limitation of a resistance value of the resistor.

As for the exterior-type process, the polymer with the resistant characteristic is coated on the substrate according to a screen printing process, and a solder mask (or solder resist) is printed on the resulting substrate so as to protect the polymer resistor.

FIGS. 1A to 1E are sectional views sequentially illustrating the production of a PCB with an exterior-type embedded resistor according to a conventional method.

With reference to FIG. 1A, after a conductive layer (copper thin layer) 2 is formed on a substrate 1, a photoresist film layer or a dry film layer 3, 3' is formed on the conductive layer 2 of the substrate 1, and thereafter, the resulting substrate 1 is exposed, developed, and copper-etched to form copper terminations with a predetermined pattern on the conductive layer 2 (first step).

The dry film 3, 3' used as an etching resist in the first step is stripped to form the copper terminations 2, 2' spaced from each other at a regular interval as shown in FIG. 1B (second step).

A carbon-based resistor paste 5 is then subjected to a screen printing process between the copper terminations 2, 2' using a squeeze blade 4 as shown in FIG. 1C (third step).

After coated on the substrate 1, the carbon-based resistor paste 5 is dried at about 150 to 250° C. and cured to form a thick film resistor 6 as shown in FIG. 1D. At this time, the thick film resistor 6 is electrically connected to the copper terminations 2, 2' (fourth step).

The carbon-based resistor paste 5 coated on the substrate 1 is selectively cut according to a laser trimming process to allow the resistor paste 5 to have a desired resistance value. In regard this, U.S. Pat. No. 5,510,594 discloses a method of obtaining the desired resistance value using the laser trimming process. When the substrate is made of the ceramic material, the laser trimming process is easily applied to the ceramic substrate and the desired resistance value is obtained. On the other hand, in the case of using the substrate made of a plastic material with a large area, it is difficult to secure the precision in the laser trimming process and to practically apply the laser trimming process to the PCB because the resistance value is changed by heat due to a laser beam, and operation costs are high.

Turning to FIG. 1E, a solder mask layer 7 is formed on the thick resistor 6 on the substrate 1 using a solder mask ink (or PSR ink) to prevent resistant properties of the PCB from being changed by external environments such as physical and chemical impact, humidity, or temperatures (fifth step).

However, in the case of the exterior-type process, the copper terminations 2, 2' exposed to external environments may be readily oxidized because of a process delay between the second and third step. If a liquid resistor paste is coated on the oxidized copper terminations 2, 2' and dried, the oxidation of the copper terminations 2, 2' is promoted. Hence, the attachment power is reduced at an interface between the resistor and the copper terminations 2, 2', and the resistance value is undesirably increased. With respect to the increase of the resistance value, the resistance value may be controlled to be small. However, the small resistance value disturbs the mass production of the PCB.

Usually, the ceramic substrate has a size of 10×10 cm or less while the resin-based substrate has a size of about 50×60 cm. Accordingly, when the resistor paste is coated on the resin-based substrate, it is non-uniformly coated on the substrate, and a non-uniform thickness of the resistor paste leads to inconsistency of resistance values according to a position of the PCB, thereby reducing reliability of the PCB.

The resistance value of the resistor may be calculated according to the following Equation 1.

$$R\text{(resistance value)} = R\text{(specific resistance)} \times \text{(length of the resistor)} / \text{(width of the resistor} \times \text{thickness of the resistor)} \quad \text{Equation 1}$$

From the above Equation 1, it can be seen that the increased thickness of the resistor brings about the lower resistance value. Practically, it is difficult to obtain the uniform resistance value because the resistor paste is not uniformly coated on the substrate due to the printing tolerance of a printing device such as a printing plate and a printer.

Accordingly, a method of forming the embedded resistor in the PCB according to a conventional screen printing process has disadvantages in that it is difficult to precisely realize a resistor width because of a limited resolution of the conventional screen printing process, a size of a pad at a contact portion is large because of the characteristics of the conventional screen printing process, and the uniform resistance value is not obtained because it is difficult to control the centers of the resistors to be uniformly lower than the terminations. Hence, a laser trimming process is needed in the conventional screen printing process.

Furthermore, in the method of forming the embedded resistor according to the conventional screen printing process, it is difficult to form the resistor with a uniform thickness regardless of a position of the PCB, and the resistor is easily damaged and the automation of the production of the PCB with the embedded resistor is not easily accomplished because the resistor is protruded from the terminations.

Therefore, there remains a need to develop a PCB with an embedded thick resistor, which realizes a desired resistance value unchanged by environments.

SUMMARY OF THE INVENTION

Accordingly, the present invention has been made keeping in mind the above problems occurring in the prior art, and an aspect of the present invention is to provide a method of producing a PCB with an embedded resistor, in which a resistor paste does not depend largely on the precision of a printing process, and workability is improved without using a high-priced screen gauze used in a conventional screen printing process.

It is another aspect of the present invention to provide a method of producing a PCB with an embedded resistor, in which the resistor has a uniform thickness because the thickness of the resistor does not depend on a position of a printing device but a thickness of a copper clad.

It is a further aspect of the present invention to provide a method of producing a PCB with an embedded resistor, in which the resistor has the same thickness as a copper clad, thus when other materials are layered on the resistor, the resistor is not deformed, thereby a resistance value change remains constant.

It is still another aspect of the present invention to provide a method of producing a PCB with an embedded resistor having a desired resistance value without a laser trimming process.

It is still another aspect of the present invention to provide a method of producing a PCB with an embedded resistor electrically connected to other components without a wider contact pad than a circuit.

It is still another aspect of the present invention to provide a method of producing a PCB with an embedded resistor, in which the resistor is embedded in the PCB to increase a density of parts per unit area of the PCB. Thereby, the PCB can be applied to highly integrated electronic devices.

It is still another aspect of the present invention to provide a method of producing a PCB with an embedded resistor, in which the formation of voids in a resistor paste is suppressed by a vacuum printing process, thereby a precision resistance value is secured.

It is still another aspect of the present invention to provide a method of producing a PCB with an embedded resistor, in which resistance tolerance almost does not exist according to a position of the resistor embedded in the PCB, thereby reliability of the production of the PCB is secured.

It is still another aspect of the present invention to provide a method of producing a PCB with an embedded resistor, in which the resistor is embedded in inner layers of the PCB as well as in outer layers of the PCB, and the resistor is rarely damaged by a press process in case that the resistor is embedded in the inner layers of the PCB.

Additional aspects and/or advantages of the invention will be set forth in part in the description which follows and, in part, will be obvious from the description, or may be learned by practice of the invention.

The above and/or other aspects are achieved by providing a method of producing a PCB with an embedded resistor, including removing a portion of a copper clad of a copper clad laminate, corresponding to a space to receive the resistor, filling a resistor paste in the space, and forming a circuit pattern on the copper clad laminate in which the resistor paste is filled.

The filling of the resistor paste includes drying the resistor paste filled in the copper clad, and grinding the dried resistor paste so that the resistor paste has a same thickness as the copper clad around the resistor paste.

Additionally, the filling of the resistor paste is conducted using a vacuum printing device.

The method further includes forming a silver, gold, nickel, or platinum layer on an inner copper wall of the space to receive the resistor, prior to the filling of the resistor paste.

The method further includes plating silver, gold, nickel, or platinum on contact portions of the filled resistor, prior to the forming of the circuit pattern.

The above and/or other aspects are achieved by providing a method of producing a PCB with an embedded resistor, including removing a portion of a copper clad of a copper clad laminate, corresponding to a space to receive the resistor, filling a resistor paste in the space, plating a metal layer on the copper clad laminate including the resistor paste filled therein, and forming a circuit pattern on the resulting copper clad laminate.

The filling of the resistor paste includes drying the resistor paste filled in the copper clad, and grinding the dried resistor paste so that the resistor paste has a same thickness as the copper clad around the resistor paste.

Further, the filling of the resistor paste is conducted using a vacuum printing device.

The method further includes plating silver, gold, nickel, or platinum on an inner copper wall of the space to receive the resistor, prior to the filling of the resistor paste.

The method further includes providing a material with excellent electric conductivity on contact portions of the resistor paste, after the filling of the resistor paste.

The above and/or other aspects are achieved by providing a method of producing a PCB with an embedded resistor, including forming a plating resist pattern on a portion of a copper clad laminate corresponding to a first space to receive a portion of the resistor, plating the copper clad laminate on which the plating resist pattern is formed, to form a plated layer on a copper clad, forming an etching resist pattern on the plated copper clad laminate to etch the portion of the copper clad corresponding to the first space to receive the portion of the resistor, removing the plating resist pattern, etching the copper clad laminate from which the plating resist pattern is removed, filling a resistor paste in a second space to receive the whole resistor, and forming a circuit pattern on the resulting copper clad laminate.

The filling of the resistor paste includes drying the resistor paste filled in the copper clad laminate, and grinding the dried resistor paste so that the resistor paste has a same thickness as the copper clad around the resistor paste.

Furthermore, the filling of the resistor paste is conducted using a vacuum printing device.

The method further includes plating silver, gold, nickel, or platinum on an inner copper wall of the space to receive the resistor, prior to the filling of the resistor paste.

The method further includes plating silver, gold, nickel, or platinum on contact portions of the filled resistor, prior to the forming of the circuit pattern.

The method further includes plating a metal material on the copper clad laminate in which the resistor paste is filled.

BRIEF DESCRIPTION OF THE DRAWINGS

This and other aspects and advantages of the invention will become apparent and more readily appreciated from the following description of the preferred embodiments, taken in conjunction with the accompanying drawing of which.

DETAILED DESCRIPTION OF THE PREFERRED EMBODIMENTS

Reference will now be made in detail to the present preferred embodiments of the present invention, examples of which are illustrated in the accompanying drawing.

FIGS. 2A to 2D are sectional views illustrating the production of a PCB with an embedded resistor according to the first embodiment of the present invention.

Figure 1A:
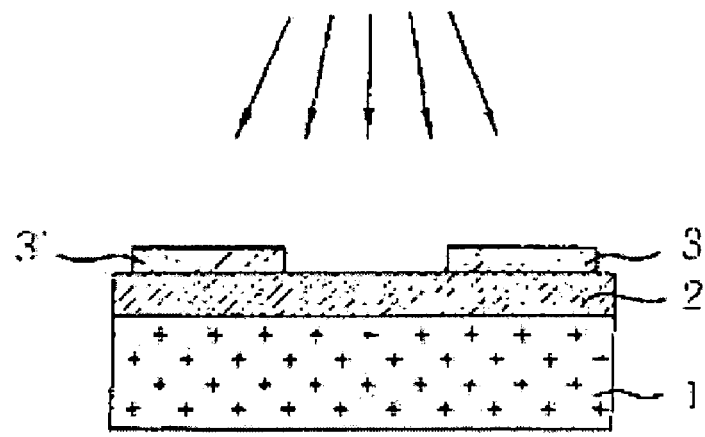
FIGS. 1A to 1E are sectional views sequentially illustrating the production of a PCB with an embedded resistor according to a conventional method.
Figure 1B:
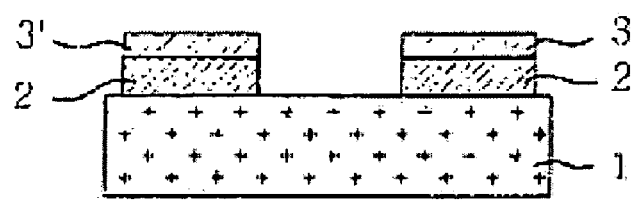
Figure 1B:
Figure 1B:
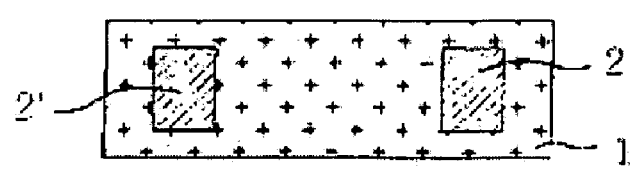
Figure 1C:
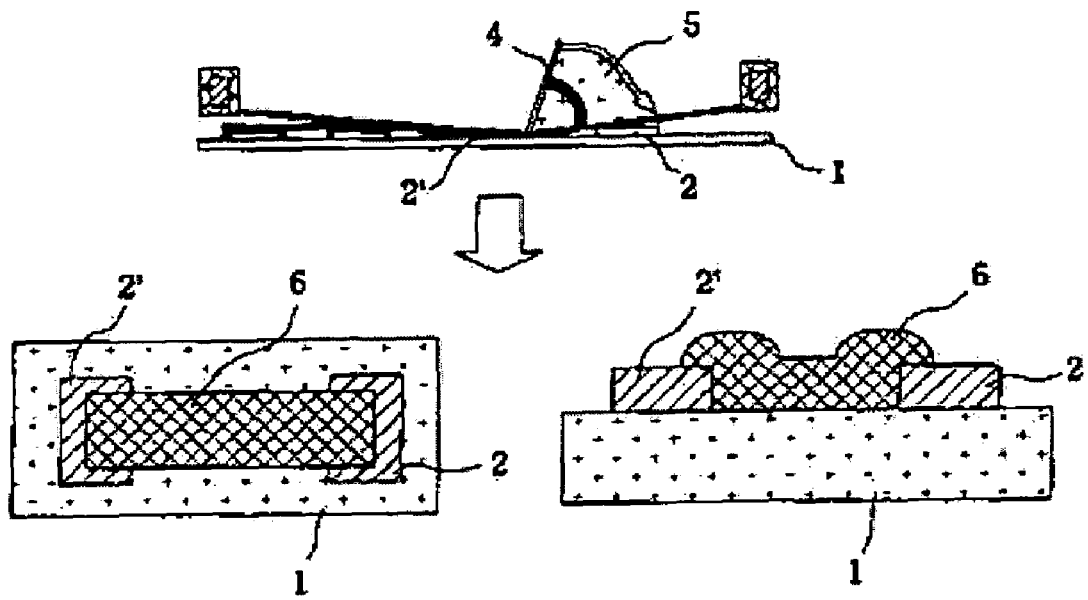
Figure 1D:
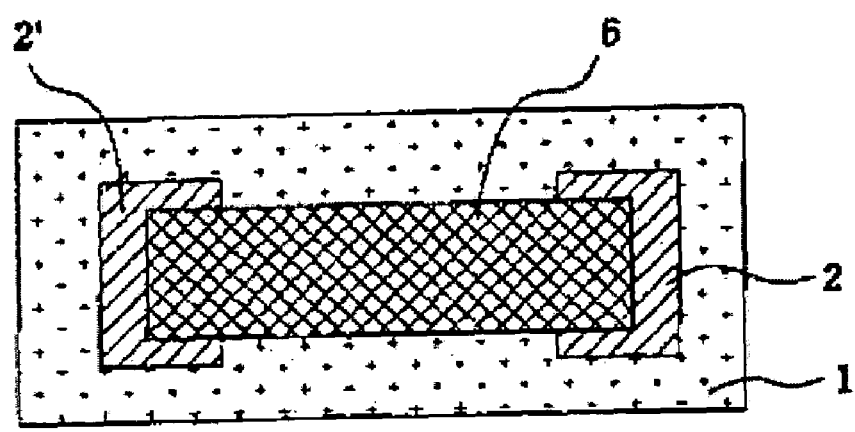
Figure 1E:
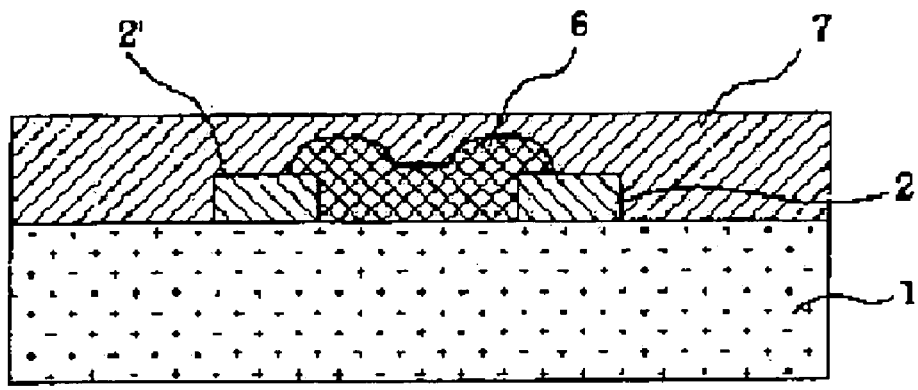
Figure 2A:
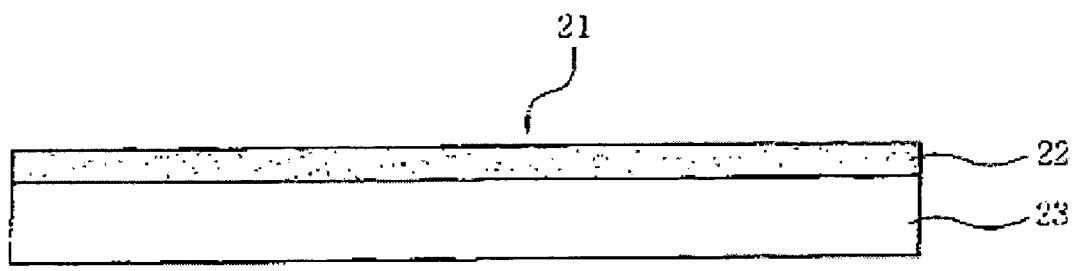
FIGS. 2A to 2D are sectional views illustrating the production of a PCB with an embedded resistor according to the first embodiment of the present invention.

With reference to FIG. 2A, there is illustrated a sectional view of a copper clad laminate 21 used as a base substrate. The copper clad laminate 21 is a thin laminate composed of a reinforcing base substrate 23 and a copper clad 22 coated on the reinforcing base substrate 23. Various kinds of copper clad laminates may be used to produce the PCB, but in the present invention, a FR-4 copper clad laminate, a resin-coated PCB in which a copper clad is coated on a reinforcing base substrate composed of a glass fiber added by an epoxy resin, is sufficiently competitive in terms of production costs of the copper clad laminate.

An etching resist is coated on the copper clad 22 of the copper clad laminate 21, exposed, and developed using a mask film on which a resistor paste pattern is printed to form an etching resist pattern on the copper clad 22. The developed copper clad laminate 21 is then etched to remove a portion of the copper clad 22 corresponding to a space 24 to be filled with a resistor paste 26.

Figure 2B:
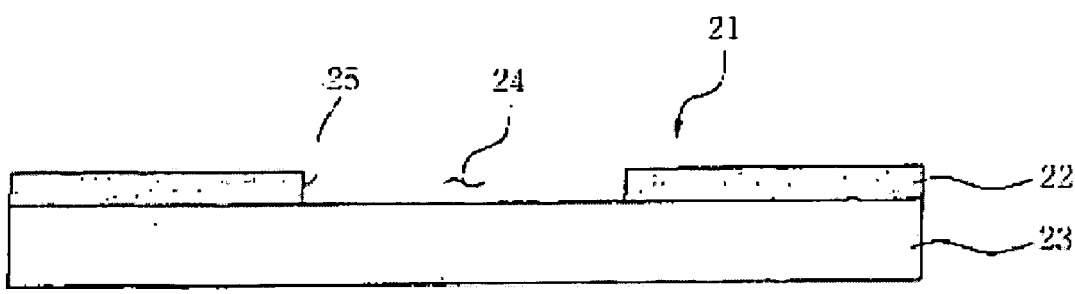

FIG. 2B is a sectional view of the copper clad laminate 21 from which a portion of the copper clad 22 corresponding to the space 24 to be filled with the resistor paste 26 is removed. At this time, it is preferable that a dry film is used as the etching resist.

Figure 3A:
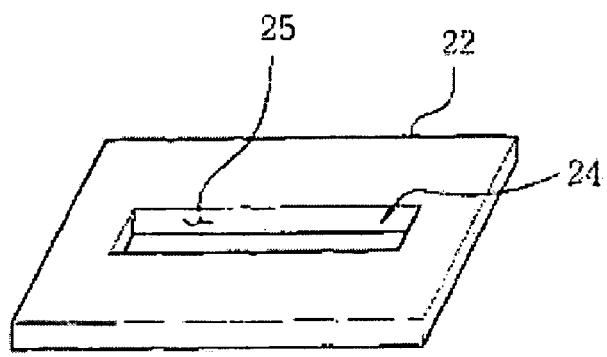
FIGS. 3A to 3D are perspective views sequentially illustrating a state of a copper clad in a procedure of producing a PCB with an embedded resistor according to the present invention.

FIG. 3A is a perspective view of the copper clad 22 of which a portion corresponding to the space 24 to be filled with the resistor paste 26 is removed. For convenience of the understanding, in FIG. 3A, only the copper clad 22 is shown, but the reinforcing base substrate 23 is not.

After a portion of the copper clad 22 corresponding to the space 24 to be filled with the resistor paste 26 is removed, metals with excellent electric conductivity such as silver, gold, platinum, or nickel may be plated on an inner wall 25 of the space 24 to be filled with the resistor paste 26 so as to reduce resistance tolerance caused by the contact resistance of the resistor paste 26.

Figure 2C:
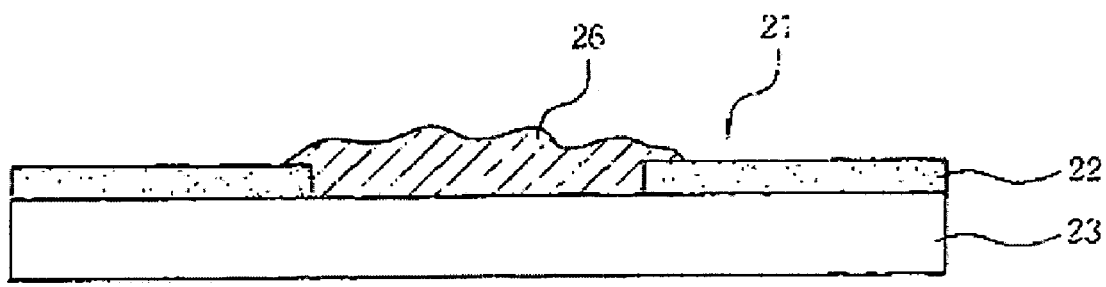

Referring to FIG. 2C, the resistor paste 26 is filled in the space 24 formed by removing the portion of the copper clad 22 using a printing device so that the resistor paste 26 has the same height as the copper clad 22. At this time, a carbon-based resistor paste in which carbon black particles are incorporated in a polymer matrix may be preferably used as the resistor paste 26.

Additionally, it is preferable to use a vacuum printing device instead of a conventional screen printing device to reduce the resistance tolerance and suppress the formation of voids in the resistor paste.

In the case of the conventional screen printing device usually used in producing a conventional PCB, ink is injected into fine holes under the atmosphere, thus a large quantity of air bubbles are contained in the ink filled in the fine holes. On the other hand, in the case of the vacuum printing device, a printing process is conducted under a vacuum to prevent the ink filled in the fine holes from containing the air bubbles. The vacuum printing device is advantageous in that the ink filled in the fine holes does not contain the air bubbles unlike the conventional screen printing device. Additionally, in case that the ink is injected into a hole with its one end being closed using the vacuum printing device, the injection of the ink into the hole is easily accomplished.

Figure 3B:
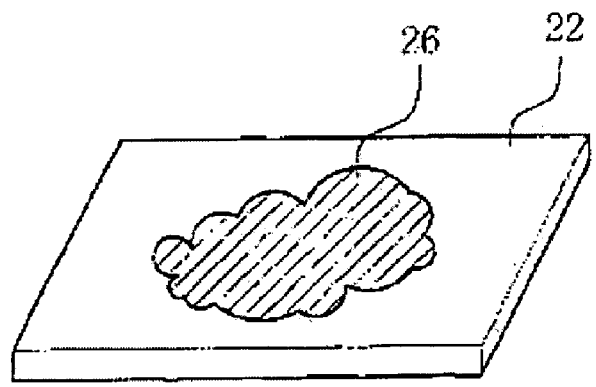

The resistor paste 26 filled in the space 24 formed by removing a portion of the copper clad 22 is then dried at about 150 to 250° C. to be cured. FIG. 3B is a perspective view illustrating the copper clad 22 in which the resistor paste 26 is embedded.

Figure 2D:
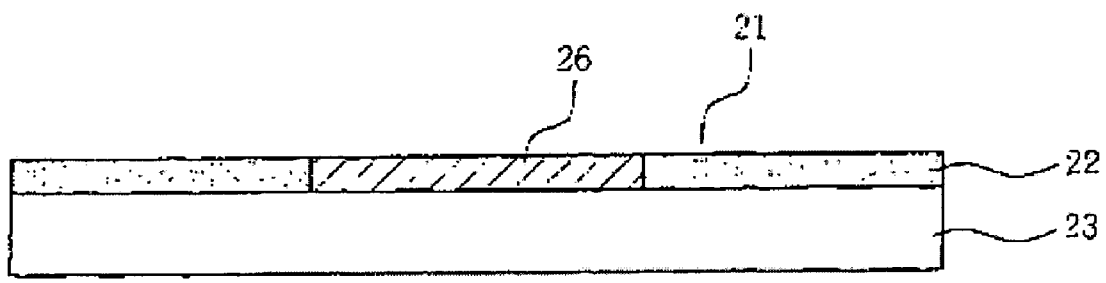
Figure 3C:
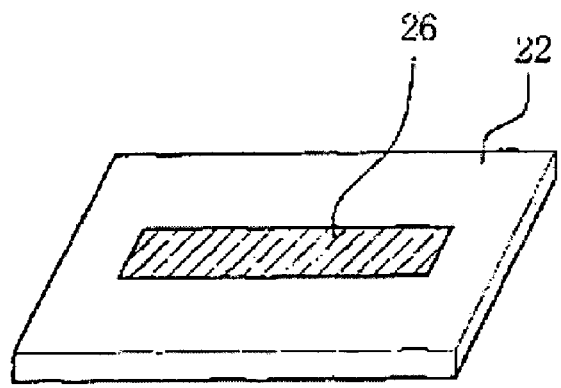

Turning to FIG. 2D, a portion of the resistor paste 26 protruded from the copper clad 22 is ground and removed so that the resistor paste 26 has the same height as the copper clad 22. FIG. 3C illustrates the ground copper clad 22.

Figure 3D:
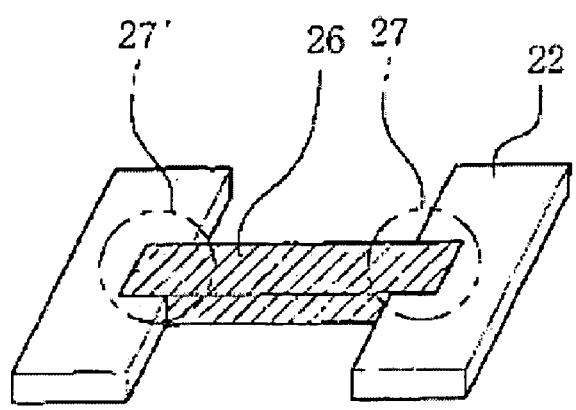

The etching resist pattern is then formed on the copper clad 22 of the copper clad laminate 21, and a portion of the copper clad 22 is etched to form a circuit pattern on the copper clad laminate 21, thereby accomplishing the PCB with the embedded resistor. FIG. 3D illustrates the patterned copper clad 22 in which the resistor 26 is embedded.

Meanwhile, a process of forming the circuit pattern includes steps, such as a step of forming via holes, a plating step, and a layering step, conducted in a conventional process of producing the PCB.

Metals with excellent conductivity such as silver, gold, nickel, or platinum may be plated on the resistor 26 so as to electrically connect the resistor 26 to other components of the PCB and to reduce the contact resistance tolerance of the resistor 26 at contact portions 27, 27' of the resistor 26. The contact portions 27, 27' may have various shapes such as a circle and an oval to enlarge areas of the contact portions 27, 27'.

Figure 4:
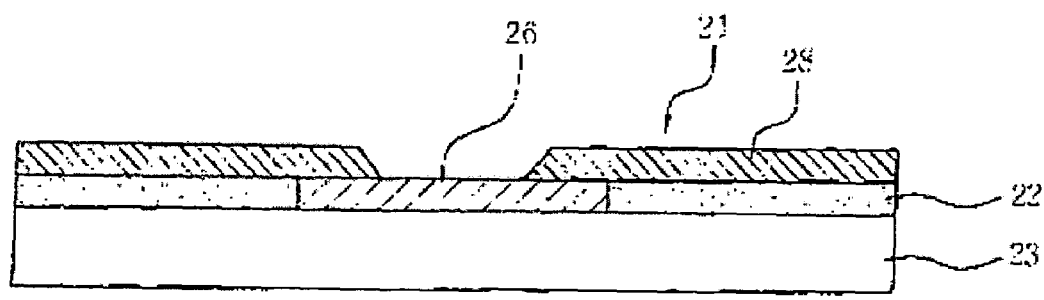
FIG. 4 is a sectional view of the PCB according to the present invention, in which a metal layer is additionally plated on the copper clad and a portion of the resistor to reduce resistance tolerance caused by the contact resistance of a resistor paste.
Figure 5:
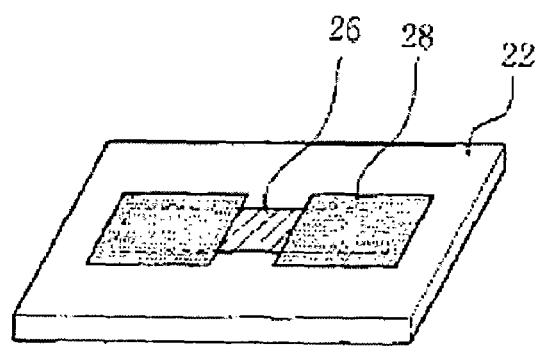
FIG. 5 is a perspective view of the PCB of FIG. 4.

FIG. 4 is a sectional view of the PCB according to the present invention, in which a metal layer 28 is additionally plated on the copper clad 22 and a portion of the resistor to reduce resistance tolerance caused by the contact resistance of the resistor paste 26, and FIG. 5 is a perspective view of the PCB of FIG. 4.

When the circuit pattern is formed and the components of the PCB are connected to each other to form a circuit, the metal layer 28 acts as an electric contact between the embedded resistor and the other components to enlarge a contact area of the embedded resistor, thereby reducing the resistance tolerance and improving reliability of the PCB.

Referring to FIGS. 6A to 6E, after the resistor paste 66 is ground as shown in FIG. 2D or 3C, a copper plated layer is additionally layered on a copper clad 62 and resistor paste 66, and a circuit pattern is then formed on a copper clad laminate 61 according to the second embodiment of the present invention.

Figure 6A:
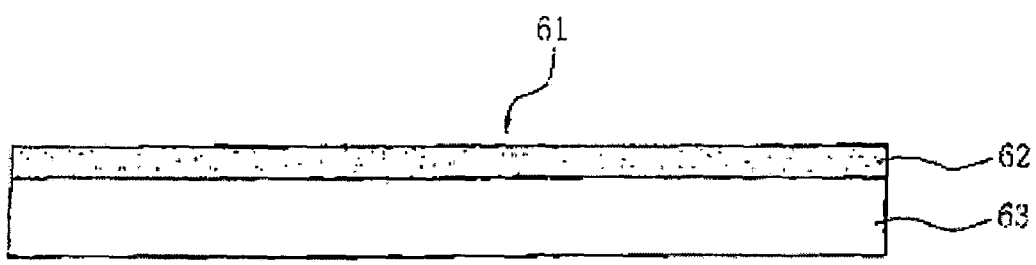
FIGS. 6A to 6E are sectional views sequentially illustrating the production of a PCB with an embedded resistor according to the second embodiment of the present invention.

FIG. 6A is a sectional view of a copper clad laminate 61 used as a base substrate. The copper clad laminate 61 is a thin laminate composed of a reinforcing base substrate 63 and the copper clad 62 coated on the reinforcing base substrate 63. Various kinds of copper clad laminates may be used to produce a PCB, but in the present invention, it is preferable to use a FR-4 copper clad laminate in which a copper clad is coated on a reinforcing base substrate composed of a glass fiber added by an epoxy resin.

Figure 6B:
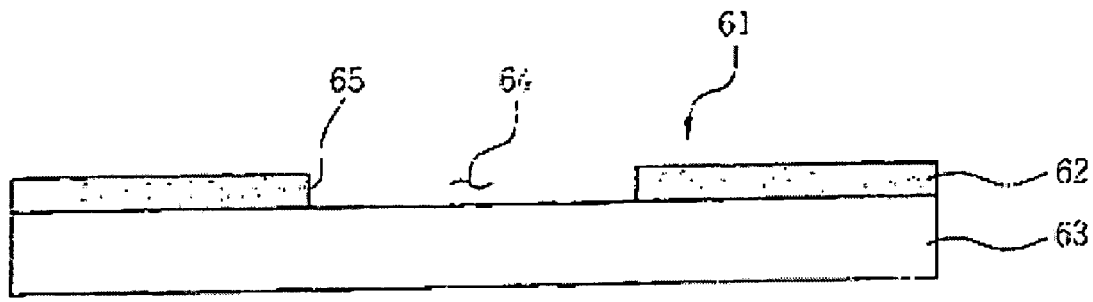
Figure 7A:
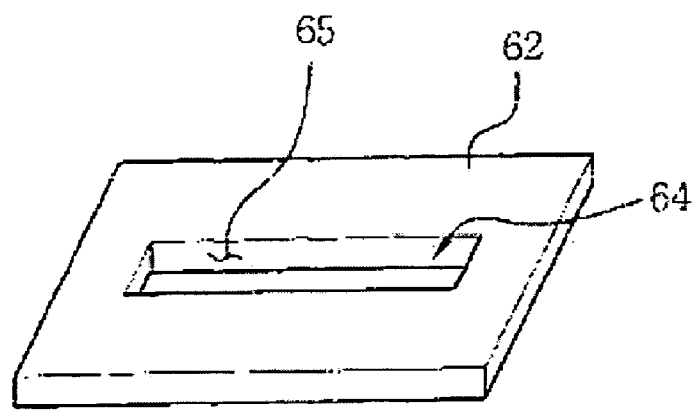
FIGS. 7A to 7E are perspective views sequentially illustrating a state of a copper clad in a procedure of producing the PCB of FIGS. 6A to 6E.

With reference to FIG. 6B, an etching resist pattern is formed on a portion of the copper clad 62 on the copper clad laminate 61, corresponding to a space 64 to be filled with a resistor paste 66, using a mask film, and the resulting copper clad laminate 61 is then etched to remove a portion of the copper clad 62 corresponding to the space 64 to be filled with the resistor paste 66. At this time, it is preferable that a dry film is used as an etching resist. The copper clad 62 of which a portion corresponding to the space 64 to be filled with the resistor paste 66 is removed is illustrated in FIG. 7A.

After a portion of the copper clad 62 corresponding to the space 64 to be filled with the resistor paste 66 is removed, metals with excellent electric conductivity such as silver, gold, nickel, or platinum may be plated on an inner copper wall 65 of the space 64 to be filled with the resistor paste 66 so as to reduce contact resistance tolerance of the resistor paste 66.

Figure 6C:
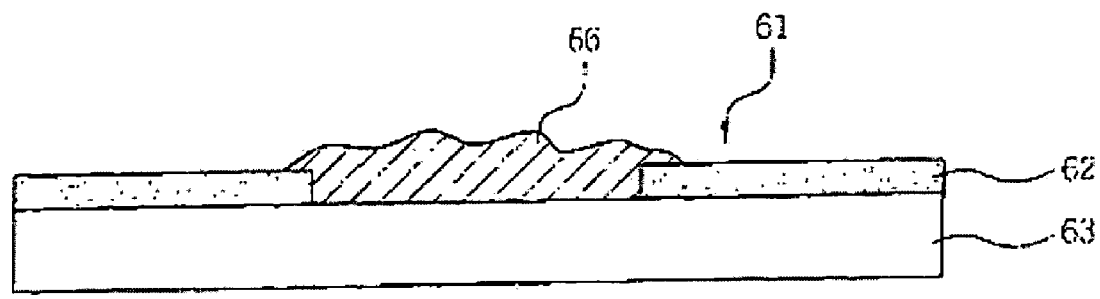

Referring to FIG. 6C, the resistor paste 66 is filled in the space 64 formed by removing a portion of the copper clad 62 using a printing device so that the resistor paste 66 has almost the same height as the copper clad 62.

At this time, a carbon-based resistor paste in which carbon black particles are incorporated in a polymer matrix may be preferably used as the resistor paste 66.

Figure 7B:
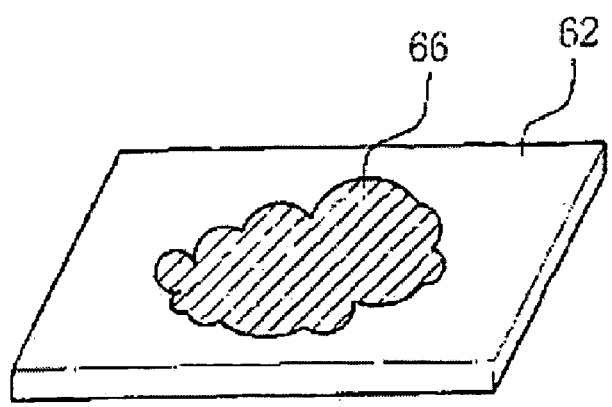

Additionally, it is preferable to use a vacuum printing device instead of a conventional screen printing device to reduce the resistance tolerance and suppress the formation of voids in the resistor paste 66. The resistor paste 66 filled in the space 64 formed by removing a portion of the copper clad 62 is then dried at about 150 to 250° C. to be cured. FIG. 7B is a perspective view illustrating the copper clad 62 in which the resistor paste 66 is embedded.

Figure 6D:
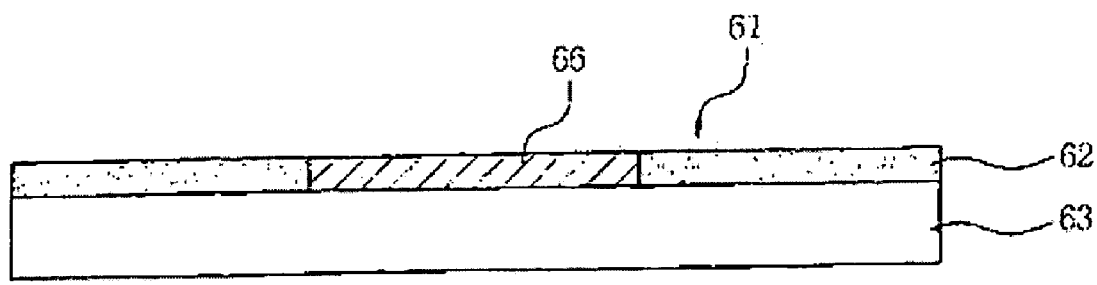
Figure 7C:
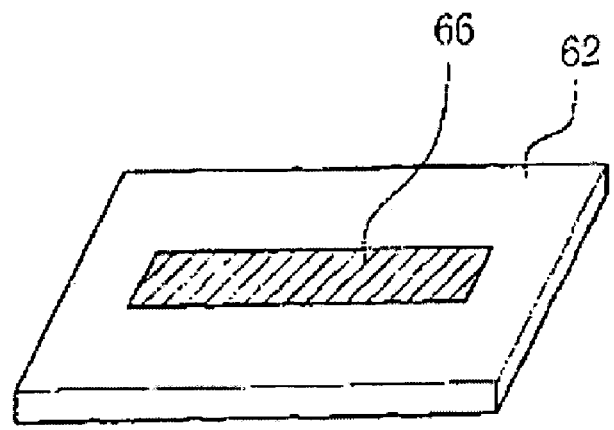

Turning to FIG. 6D, a portion of the resistor paste 66 protruded from the copper clad 62 is ground and removed so that the resistor paste 66 has the same height as the copper clad 62. FIG. 7C illustrates the ground copper clad 62.

Figure 6E:
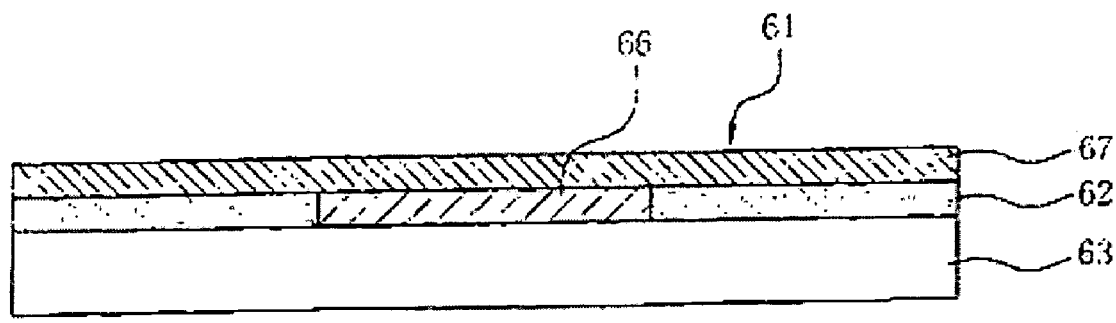
Figure 7D:
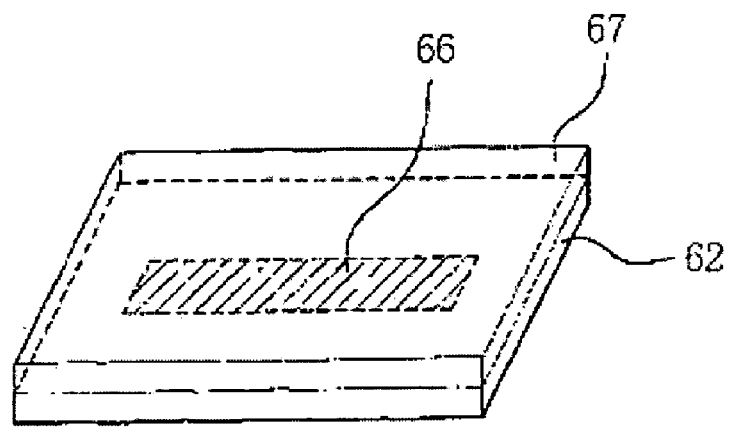

Referring to FIG. 6E, a metal layer 67 is additionally plated on the copper clad 62 and resistor paste 66 to completely embed the resistor in the PCB. FIG. 7D illustrates a perspective view of the copper clad 62 on which the metal layer 67 is additionally plated, and in which the resistor is embedded.

In other words, metals with excellent conductivity such as silver, gold, nickel, or platinum may be plated on the resistor 66 of FIG. 6D so as to electrically connect the resistor 66 to other components of the PCB and to reduce the contact resistance tolerance of the resistor 66 at contact portions of the resistor 66. The contact portions may have various shapes such as a circle and an oval to enlarge areas of the contact portions.

Figure 7E:
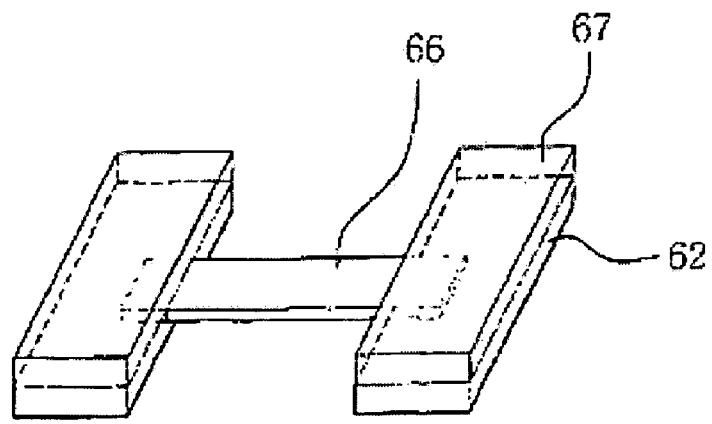

The etching resist pattern is then formed on the copper clad 62 of the copper clad laminate 61, and a portion of the copper clad 62 is etched to form a circuit pattern on the copper clad laminate 61, thereby accomplishing the PCB with the embedded resistor. FIG. 7E illustrates the patterned copper clad 62 in which the resistor 66 is embedded. Meanwhile, a process of forming the circuit pattern includes steps, such as a step of forming via holes, a plating step, and a layering step, conducted in a conventional process of producing the PCB.

According to the third embodiment of the present invention, as shown in FIGS. 8A to 8H, after a plating resist pattern 84 is formed on a portion of a copper clad 82 corresponding to a space to be filled with a resistor paste 88 so as to prevent such portion of the copper clad 82 from being plated with a metal, the copper clad laminate 81 is then plated with the metal. An etching resist is selectively formed on the copper clad laminate 81 plated with the metal, the plating resist pattern 84 is removed from the copper clad laminate 81, a portion of the copper clad 82 corresponding to the space to be filled with the resistor paste 88 is etched and removed, and the resistor paste 88 is filled in a space formed by the copper clad 82, a copper plated layer 85, and the copper clad laminate 81, thereby forming a resistor on the copper clad laminate 81.

Figure 8A:
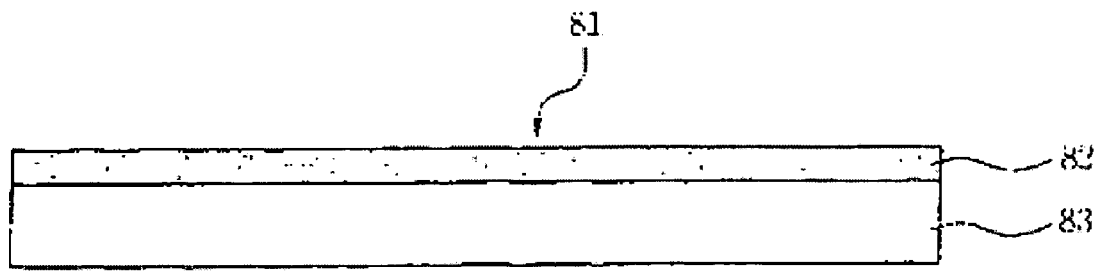
FIGS. 8A to 8H are sectional views sequentially illustrating the production of a PCB with an embedded resistor according to the third embodiment of the present invention.

FIG. 8A is a sectional view of the copper clad laminate 81 used as a base substrate. The copper clad laminate 81 is a thin laminate composed of a reinforcing base substrate 83 and the copper clad 82 coated on the reinforcing base substrate 83. Various kinds of copper clad laminates may be used to produce a PCB, but in the present invention, it is preferable to use a FR-4 copper clad laminate in which a copper clad is coated on a reinforcing base substrate composed of a glass fiber added by an epoxy resin.

Figure 8B:
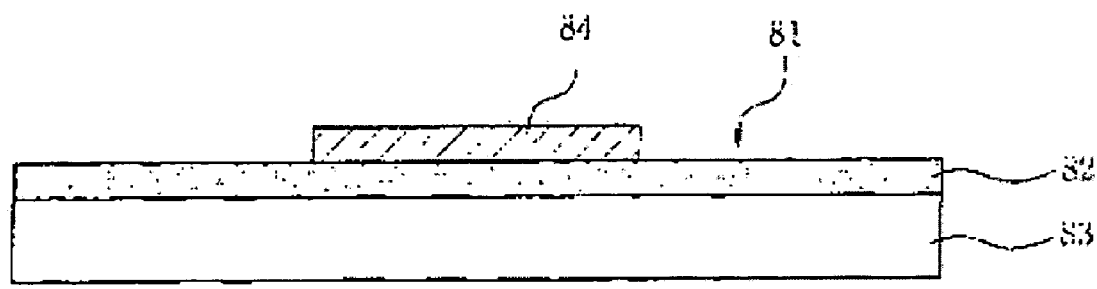
Figure 9A:
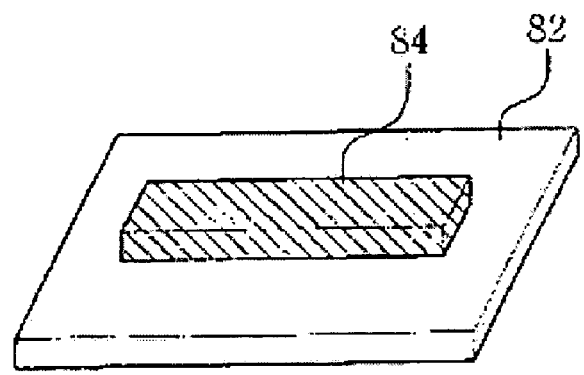
FIG. 9A is a perspective view illustrating a copper clad of FIG. 8B, on which a plating resist pattern is formed.

With reference to FIG. 8B, the plating resist pattern 84 is formed on a portion of the copper clad 82 corresponding to the space to be filled with the resistor paste 88. The copper clad 82 on which the plating resist pattern 84 is formed is illustrated in FIG. 9A.

Figure 8C:
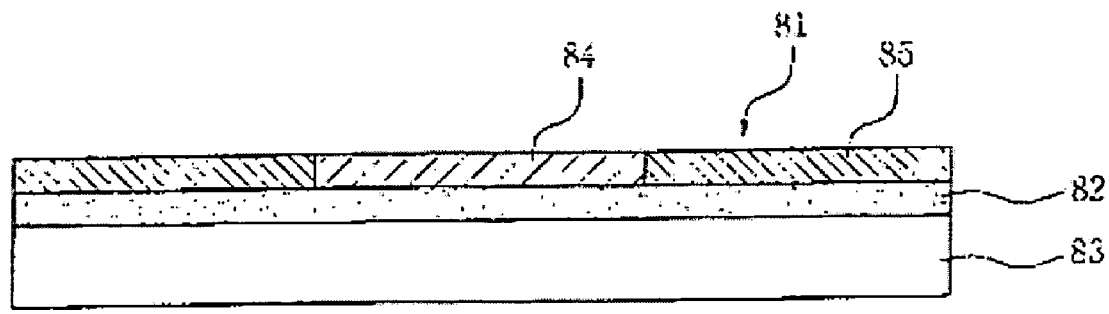

Referring to FIG. 8C, the copper clad laminate 81 on which the plating resist pattern 84 is formed is plated with copper to form a copper plated layer 85 thereon. At this time, a portion of the copper clad laminate 81 on which the plating resist pattern 84 is formed is not plated with copper.

Figure 8D:
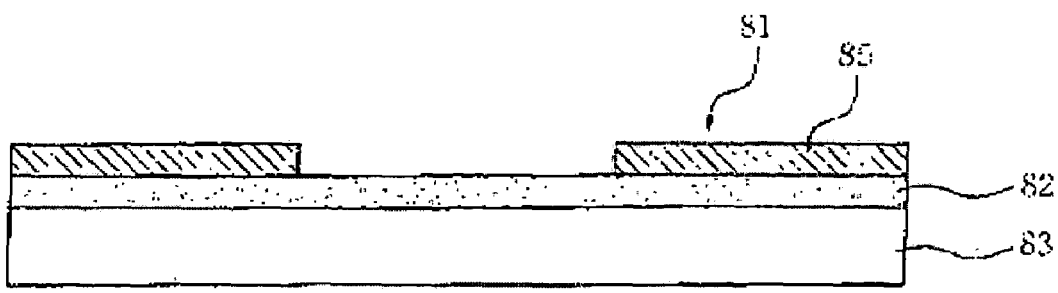

Turning to FIG. 8D, the plating resist pattern 84 is removed from the copper clad laminate 81 using a release agent.

Figure 8E:
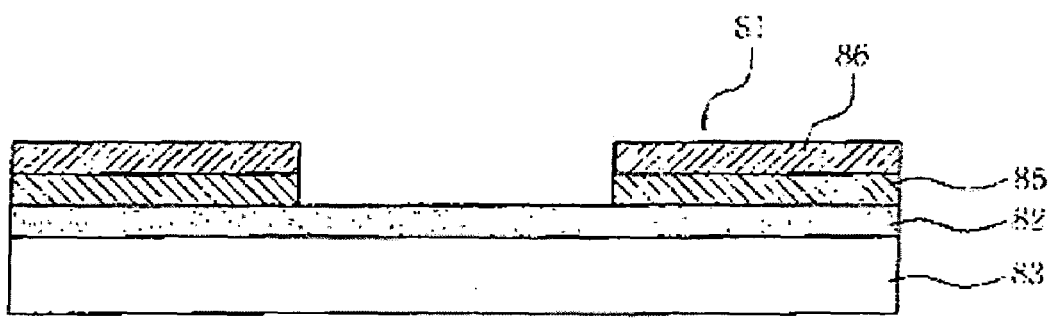

As shown in FIG. 8E, an etching resist pattern 86 is formed on the remaining portion of the copper clad laminate 81 except for a portion of the copper clad laminate 81 on which the resistor paste 88 is formed. Various kinds of materials may be used as the etching resist 86, but Sn is most useful in the present invention.

Figure 8F:
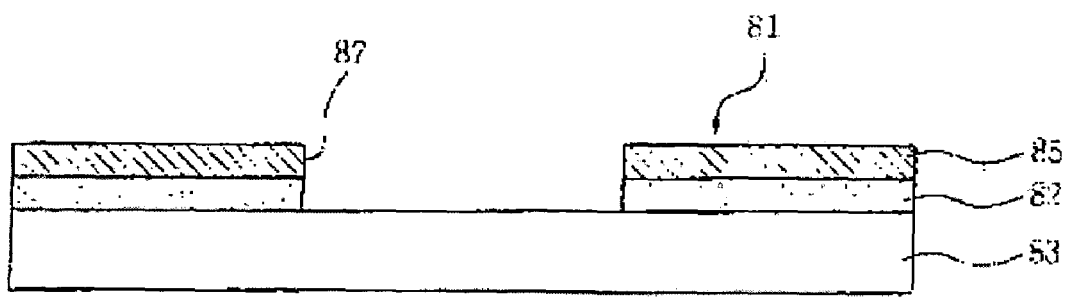

In FIG. 8F, a portion of the copper clad 82 corresponding to the space to be filled with the resistor paste 88 is etched and removed.

Figure 8G:
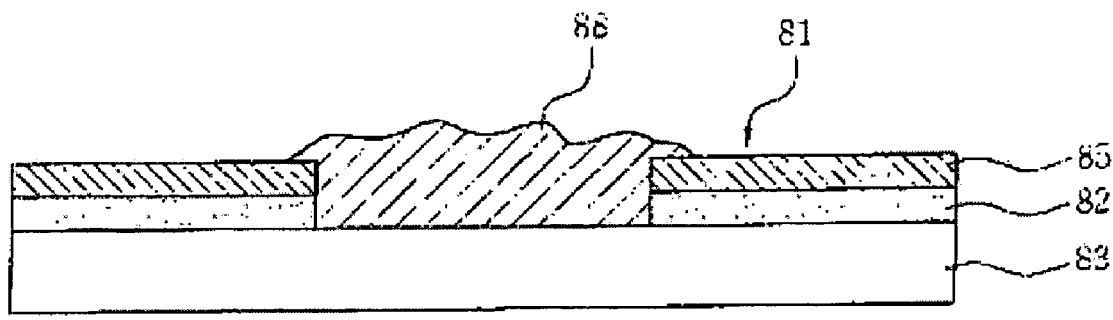

Referring to FIG. 8G, the resistor paste 88 is filled in the space formed by the copper clad 82, copper plated layer 85, and copper clad laminate 81 using a printing device so that a height of the resistor paste 88 is almost the same as a total height of the copper clad and copper plated layer 82, 85. At this time, a carbon-based resistor paste in which carbon black particles are incorporated in a polymer matrix may be preferably used as the resistor paste 88.

Additionally, it is preferable to use a vacuum printing device instead of a conventional screen printing device to reduce resistance tolerance and suppress the formation of voids in the resistor paste 88. The resistor paste 88 filled in the space 84 formed by removing portions of the copper clad 82 and copper plated layer 85 is then dried at about 150 to 250° C. to be cured.

Figure 8H:
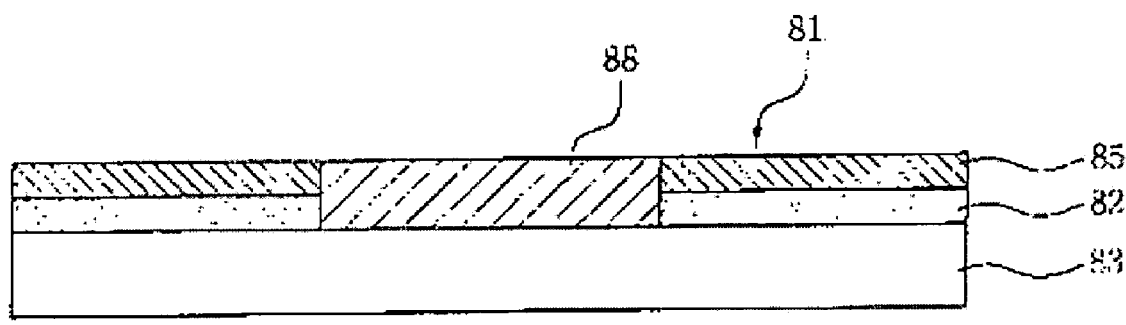
Figure 9B:
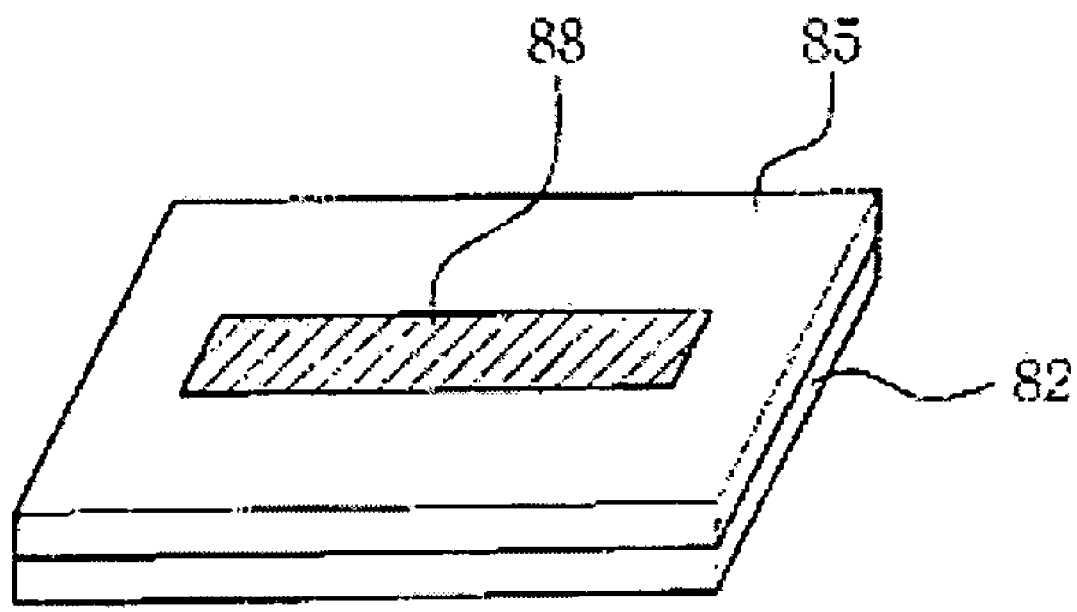
FIG. 9B is a perspective view illustrating the copper clad and a copper plated layer of FIG. 8H, through which a ground resistor paste is embedded.

With reference to FIG. 8H, a portion of the resistor paste 88 protruded from the copper plated layer 85 is ground and removed so that the height of the resistor paste 88 is the same as a total height of the copper clad and copper plated layer 82, 85. FIG. 9B is a perspective view illustrating the ground copper clad 82.

Metals with excellent conductivity such as silver, gold, platinum, or nickel may be plated on the resistor paste 88 so as to secure contact of the resistor at electric contact portions of the resistor paste 88. The electric contact portions may have various shapes to enlarge areas of the electric contact portions. A metal layer formed on the contact portions serves to reduce contact resistance tolerance of the resistor when a circuit pattern is formed and components of the PCB are connected to each other to form a circuit.

Furthermore, the metal layer as shown in FIG. 6E or 7D may be additionally plated on the copper clad laminate of FIG. 8H to completely embed the resistor in the PCB.

As apparent from the above description, the present invention provides a method of producing a PCB with an embedded resistor, in which a resistor paste does not depend largely on the precision of a screen printing process, and workability is improved without using a high-priced screen gauze used in a conventional screen printing process.

Additionally, the present invention provides a method of producing a PCB with an embedded resistor, in which the resistor has a uniform thickness because the thickness of the resistor does not depend on a position of a printing device but a thickness of a copper clad.

Further, the present invention provides a method of producing a PCB with an embedded resistor, in which the resistor has the same thickness as a copper clad, thus when other materials are layered on the resistor, the resistor is not deformed, thereby a resistance value change remains constant.

Furthermore, the present invention provides a method of producing a PCB with an embedded resistor having a desired resistance value without a laser trimming process.

Moreover, the present invention provides a method of producing a PCB with an embedded resistor electrically connected to other components without a wider contact pad than a circuit.

In addition, the present invention provides a method of producing a PCB with an embedded resistor, in which the resistor is embedded in the PCB to increase a density of parts per unit area of the PCB. Thereby, the PCB can be applied to highly integrated electronic devices.

Furthermore, the present invention provides a method of producing a PCB with an embedded resistor, in which the formation of voids in a resistor paste is suppressed by a vacuum printing process, thereby a precision resistance value is secured.

Furthermore, the present invention provides a method of producing a PCB with an embedded resistor, in which resistance tolerance does not nearly exist according to a position of the resistor embedded in the PCB, thereby the reliability of the production of the PCB is secured.

Additionally, the present invention provides a method of producing a PCB with an embedded resistor, in which the resistor is embedded in inner layers of the PCB as well as in outer layers of the PCB, and the resistor is rarely damaged by a press process in case that the resistor is embedded in the inner layers of the PCB.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

The embodiments of the invention in which an exclusive property or privilege is claimed are defined as follows:

1. A method of producing a printed circuit board with an embedded resistor, comprising:
   removing a portion of a copper clad of a copper clad laminate, corresponding to a space to receive the resistor;
   filling in the space with a sufficient amount of resistor paste so that the entire space is filled with dried resistor paste having a thickness after the resistor paste has dried, the thickness of the dried resistor paste being the same as the thickness of the copper clad around the dried resistor paste; and
   forming a circuit pattern on the copper clad laminate in which the resistor paste is filled.

2. The method as set forth in claim 1, wherein the filling of the resistor paste comprises:
   drying the resistor paste filled in the copper clad; and
   grinding the dried resistor paste so that the resistor paste has a same thickness as the copper clad around the resistor paste.

3. The method as set forth in claim 1, wherein the filling of the resistor paste is conducted using a vacuum printing device.

4. The method as set forth in claim 1, further comprising forming a silver, gold, nickel, or platinum layer on an inner copper wall of the space to receive the resistor, prior to the filling of the resistor paste.

5. The method as set forth in claim 1, further comprising plating silver, gold, nickel, or platinum on contact portions of the filled resistor, prior to the forming of the circuit pattern.

6. The method as set forth in claim 1, further comprising plating a metal layer on the copper clad laminate including the resistor paste filled therein, between the filling a resistor paste and the forming the circuit pattern.

7. The method as set forth in claim 6, wherein the filling of the resistor paste comprises:
   drying the resistor paste filled in the copper clad; and
   grinding the dried resistor paste so that the resistor paste has a same thickness as the copper clad around the resistor paste.

8. The method as set forth in claim 6, wherein the filling of the resistor paste is conducted using a vacuum printing device.

9. The method as set forth in claim 6, further comprising plating silver, gold, nickel, or platinum on an inner copper wall of the space to receive the resistor, prior to the filling of the resistor paste.

10. The method as set forth in claim 6, further comprising providing a material with excellent electric conductivity on contact portions of the resistor paste, after the filling of the resistor paste.

11. The method as set forth in claim 1, further comprising forming a plating resist pattern on a portion of the copper clad laminate corresponding to the space; plating the copper clad laminate; removing the plating resist pattern; and forming an etching resist pattern on the plated copper clad laminate to etch the portion of the copper clad laminate corresponding the space, prior to the removing the portion of the copper clad laminate.

12. The method as set forth in claim 11, wherein the filling of the resistor paste comprises:
   drying the resistor paste filled in the copper clad laminate; and
   grinding the dried resistor paste so that the resistor paste has a same thickness as the copper clad around the resistor paste.

13. The method as set forth in claim 11, wherein the filling of the resistor paste is conducted using a vacuum printing device.

14. The method as set forth in claim 11, further comprising plating silver, gold, nickel, or platinum on an inner copper wall of the space to receive the resistor, prior to the filling of the resistor paste.

15. The method as set forth in claim 11, further comprising plating silver, gold, nickel, or platinum on contact portions of the filled resistor, prior to the forming of the circuit pattern.

16. The method as set forth in claim 11, further comprising plating a metal material on the copper clad laminate in which the resistor paste is filled.

* * * * *

UNITED STATES PATENT AND TRADEMARK OFFICE
CERTIFICATE OF CORRECTION

| | | |
|---|---|---|
| PATENT NO. | : 7,284,317 B2 | |
| APPLICATION NO. | : 10/770806 | |
| DATED | : October 23, 2007 | |
| INVENTOR(S) | : S.-H. Cho et al. | |

It is certified that error appears in the above-identified patent and that said Letters Patent is hereby corrected as shown below:

| COLUMN | LINE | ERROR |
|---|---|---|
| 12 (Claim 6, | 14 line 3) | "the filling a" should read --the step of filling a-- |
| 12 (Claim 6, | 15 line 4) | "the forming a" should read --the step of forming a-- |
| 12 (Claim 11, | 40 line 7) | "corresponding the space" should read --corresponding to the space-- |
| 12 (Claim 11, | 40 line 7) | "prior to the removing" should read --prior to removing-- |

Signed and Sealed this
Fifteenth Day of November, 2011

David J. Kappos
*Director of the United States Patent and Trademark Office*